(12) United States Patent
Lee et al.

(10) Patent No.: US 7,170,364 B2
(45) Date of Patent: Jan. 30, 2007

(54) IMPEDANCE MATCHING CIRCUIT WITH AUTOMATIC ADJUSTMENT AND METHOD THEREOF

(75) Inventors: Chao-Cheng Lee, Hsinchu (TW); An-Ming Lee, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/111,087

(22) Filed: Apr. 20, 2005

(65) Prior Publication Data

US 2005/0184823 A1    Aug. 25, 2005

(30) Foreign Application Priority Data

Oct. 24, 2001    (TW) .................... 90126345

(51) Int. Cl.
*H03H 7/40*    (2006.01)
(52) U.S. Cl. .................................... 333/17.3
(58) Field of Classification Search ............ 333/17.3, 333/32; 330/288; 326/30; 327/362
See application file for complete search history.

(56) References Cited

U.S. PATENT DOCUMENTS 5,666,078 A    9/1997  Lamphier et al.
6,147,520 A    11/2000 Kothandaraman et al.
6,175,278 B1 *  1/2001  Hasegawa .................... 330/278
6,265,917 B1    7/2001  Main et al.
6,535,047 B2    3/2003  Mughal et al.
6,545,522 B2    4/2003  Mughal et al.
6,556,095 B2 *  4/2003  Thompson et al. ........ 333/17.3
6,559,475 B1    5/2003  Kim
6,756,858 B2    6/2004  Gonzalez et al.

FOREIGN PATENT DOCUMENTS

WO      WO 99/09728      2/1999

* cited by examiner

*Primary Examiner*—Stephen E. Jones
(74) *Attorney, Agent, or Firm*—Rabin & Berdo, P.C.

(57) ABSTRACT

The present invention discloses an impedance matching circuit with automatic adjustment and a method thereof. The impedance matching circuit comprises: a resistor, for receiving a reference voltage and generating a reference current; a detection unit, for detecting resistance variation and generating a plurality of comparison voltages according to said reference current; a comparison unit, for comparing said reference voltage with said comparison voltages, and generating a control signal; and a composite resistor unit, for receiving said control signal and generating a matched impedance. Therefore, a matched impedance value can be obtained within a designed range in despite of the manufacturing process and the operation environment.

28 Claims, 9 Drawing Sheets

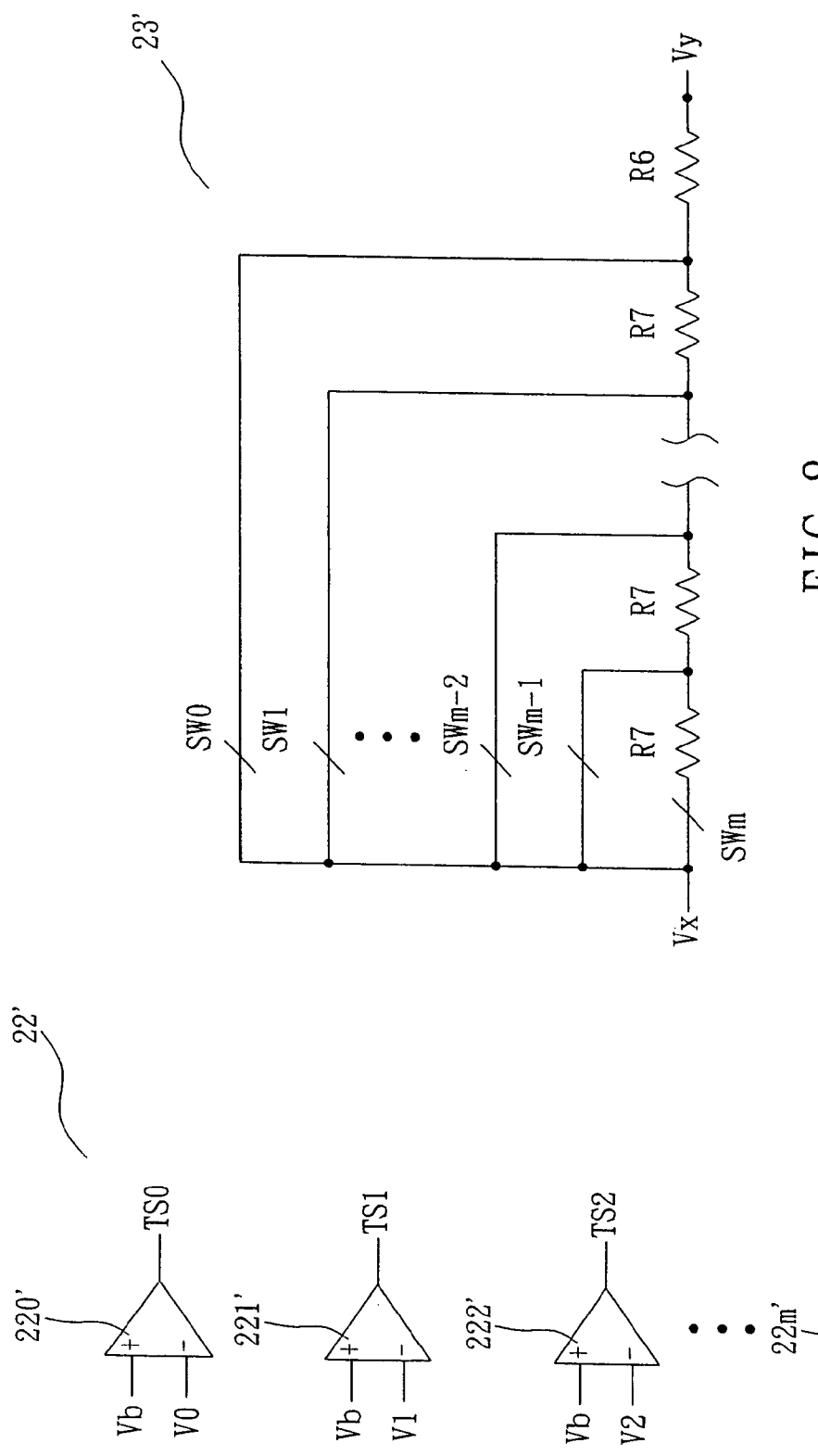

IMPEDANCE MATCHING CIRCUIT WITH AUTOMATIC ADJUSTMENT AND METHOD THEREOF

BACKGROUND OF THE INVENTION

1. Field of the Invention

The present invention generally relates to an impedance matching circuit with automatic adjustment and a method thereof and, more particularly, to an impedance matching circuit with automatic adjustment by using a composite resistor unit so as to generate a resistance value within a designed range and an impedance matching method.

2. Description of the Prior Art

For a high-speed transmission interface, as shown in FIG. 1, it is critical for the parameters such as the output impedance (Zout) of the transceiver 11, the input impedance (Zin) of the receiver 12 and the characteristic impedance of the cable 13 to meet one of the international standards so as to prevent the undesired reflection and thus achieve better transmission efficiency during signal transmission. Universal serial bus (USB 2.0) standard, for example, requires a transmission rate of 480 MHz and an output impedance of 45±10% Ω. However, the environment for operating the high-speed transmission interface may vary and the parameters of the interface may not be consistent due to the fabrication process, the output impedance may not be stable and the transmission performance may be adversely affected.

In general, among the above parameters, the output impedance is the most difficult one to keep stable. Therefore, an external device is usually added so as to perform fine tuning on the impedance value. Even though such as method can solve the problem related to the fabrication process; however, it can not overcome the inaccuracy due to the varying environment (such as temperature) during operation.

SUMMARY OF THE INVENTION

In view of these problems, it is the primary object of the present invention to provide an impedance matching circuit with automatic adjustment.

It is a secondary object of the present invention to provide an impedance matching method.

In order to achieve the foregoing objects, the present invention provides an impedance matching circuit with automatic adjustment, comprising: a resistor, for receiving a reference voltage and generating a reference current; a detection unit, for detecting resistance variation and generating a plurality of comparison voltages according to said reference current; a comparison unit, for comparing said reference voltage with said comparison voltages, and generating a control signal; and a composite resistor unit, for receiving said control signal and generating a matched impedance.

The present invention further provides an impedance matching method, comprising steps of: a detection step, including: providing a reference voltage and a reference resistor, generating a reference current according to said reference resistor, and generating a plurality of comparison voltages corresponding to various resistance values according to said reference current; a comparison step, including: comparing said reference voltage with said plurality of comparison voltages, and generating a control signal; and a composite resistor step, including: controlling a composite resistor unit having a plurality of switches by using said control signal so as to generate a matched impedance; wherein said control signal controls the operation of said switches.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms.

BRIEF DESCRIPTION OF THE DRAWINGS

The objects, spirits and advantages of the preferred embodiments of the present invention will be readily understood by the accompanying drawings and detailed descriptions, wherein:

FIG. 7 is a circuit diagram showing a comparison unit associated with the detection unit in FIG. 6;

FIG. 8 is a circuit diagram showing a composite resistor unit associated with the detection unit in FIG. 6;

DETAILED DESCRIPTION OF THE INVENTION

The present invention providing an impedance matching circuit with automatic adjustment and a method thereof can be exemplified by the preferred embodiments as described hereinafter.

Figure 1:
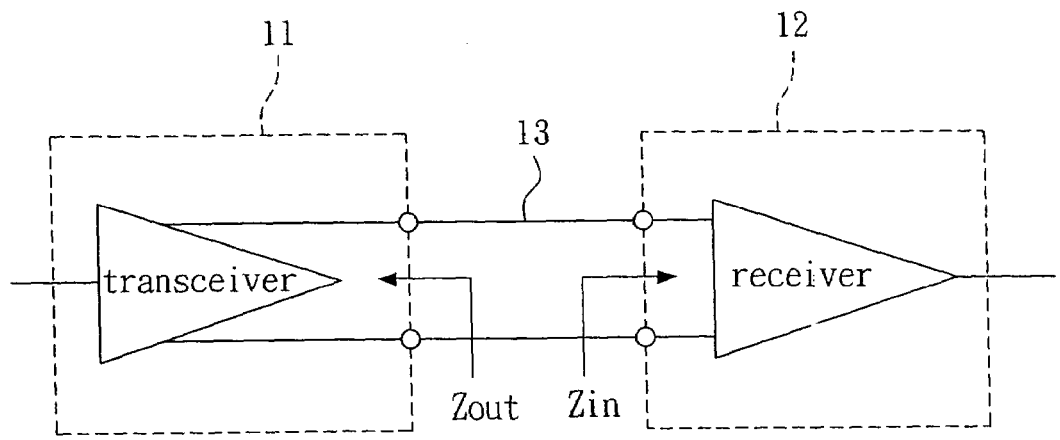
FIG. 1 is a schematic diagram showing a conventional transmission interface.
Figure 2:
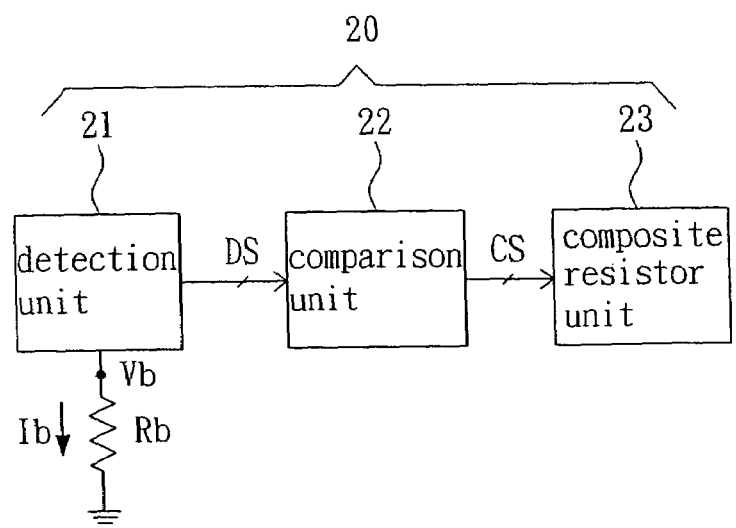
FIG. 2 is a schematic block diagram showing an impedance matching circuit with automatic adjustment in accordance with the present invention.

Please refer to FIG. 2, which is a schematic block diagram showing an impedance matching circuit with automatic adjustment in accordance with the present invention. As shown in FIG. 2, the impedance matching circuit 20 with automatic adjustment comprises a resistor Rb, a detection unit 21, a comparison unit 22 and a composite resistor unit 23. The detection unit 21 provides a reference voltage Vb across the resistor Rb, thereby generating a reference current Ib flowing through the resistor Rb. In addition, the detection unit 21 provides a plurality of current paths so as to generate a plurality of compassion voltages. The comparison unit 22 compares the reference voltage Vb and the comparison voltages so as to generate a control signal. The composite resistor unit 23 generates a resistance value according to the control signal.

Figure 3:
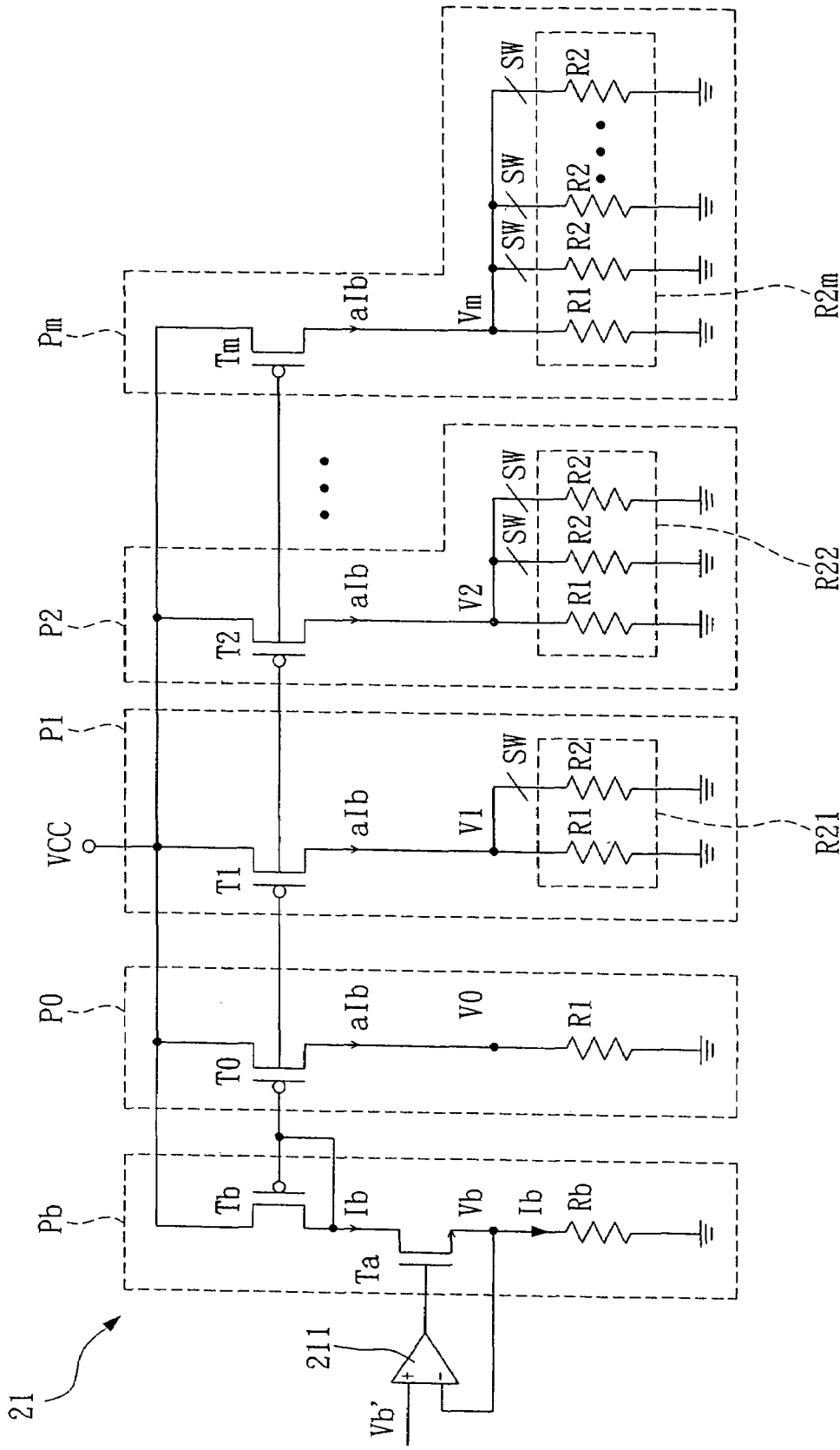
FIG. 3 is a circuit diagram showing a first embodiment of the detection unit in accordance with the present invention.

FIG. 3 is a circuit diagram showing a first embodiment of the detection unit 21 in accordance with the present invention. As shown in FIG. 3, the detection unit 21 comprises an operational amplifier 211, a reference current path Pb and (m+1) comparison current paths P0~Pm. The reference current path Pb comprises transistors Ta, Tb and the resistor Rb. The non-inverting input terminal of the operational amplifier 211 receives a reference signal Vb', the inverting input terminal is connected to the source of the transistor Ta, and the output terminal is connected to the gate of the transistor Ta. Therefore, the voltage across the resistor Rb, namely the reference voltage Vb, is nearly identical to the voltage Vb' at the non-inverting terminal of the operational amplifier 211. The reference current Ib is expressed as:

$$I_b = V_b/R_b \quad (1)$$

Therefore the current flowing through the transistor Tb is Ib. Each of the (m+1) comparison current paths P0~Pm is composed of a transistor T0~Tm and a comparison resistor R1, R21~R2m connected in series so as to generate a comparison voltage V0~Vm across the comparison resistor. A current mirror is formed of the transistor T0~Tm and the transistor Tb of the reference current path Pb. Therefore, if the transistors in each of the comparison current paths have the same aspect ratio, the currents flowing through the transistors in each of the comparison current paths will be proportional to Ib. Moreover, the resistance values in each of the comparison current paths are not identical and decrease by degrees from P0 to Pm. That is, R1>R21>R22> . . . >R2m. In the present invention, a single resistor R1 is employed in the comparison current path P0, a resistor R1 and a resistor R2 are connected in parallel in the comparison current path P1, a resistor R1 and two resistors R2 are connected in parallel in the comparison current path P2, . . . , and a resistor R1 and m resistors R2 are connected in parallel in the comparison current path Pm. The currents in each of the comparison current paths are identical, therefore the comparison voltages V0~Vm across the comparison resistors decrease by degrees. The voltages can be expressed as:

$$V_0 = aI_b \cdot R_1 = \frac{aV_b}{R_b} \cdot nR_s = \frac{anR_s}{R_b} \cdot V_b$$

$$V_1 = aI_b \cdot R_1 // R_2 = \frac{aV_b}{R_b} \cdot \frac{x}{x+1} \cdot nR_s = \frac{anR_s}{R_b} \cdot \frac{x}{x+1} \cdot V_b$$

$$V_2 = aI_b \cdot R_1 // R_2 // R_3 = \frac{aV_b}{R_b} \cdot \frac{x}{x+2} \cdot nR_s = \frac{anR_s}{R_b} \cdot \frac{x}{x+2} \cdot V_b$$

...

$$V_m = aI_b \cdot R_1 // R_2 // \ldots // R_3 = \frac{aV_b}{R_b} \cdot \frac{x}{x+m} \cdot nR_s = \frac{anR_s}{R_b} \cdot \frac{x}{x+m} \cdot V_b$$

wherein R1 equals to $n \cdot R_s$, R2 equals to $x \cdot n \cdot R_s$ and Rs is the sheet resistance per unit area. Moreover, in the comparison current paths P1~Pm, switches SW are employed to compensate the resistance values of the control switches of the composite resistors. Therefore, all the switches are on ON states.

Figure 4:
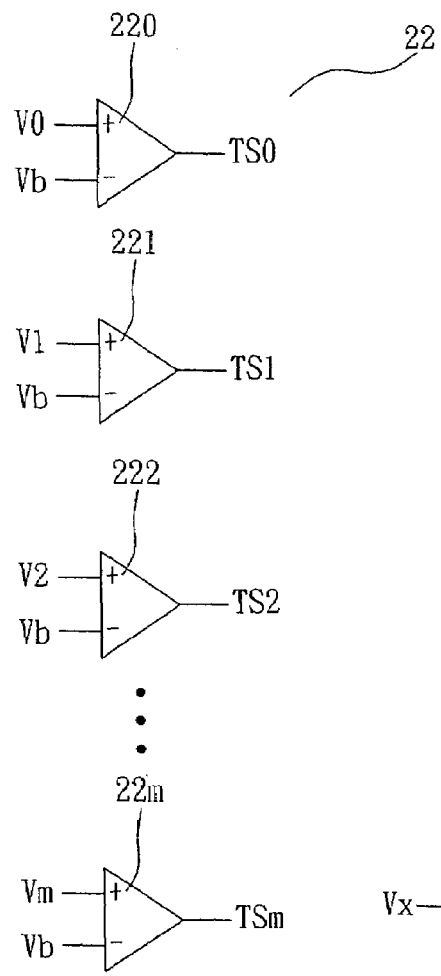
FIG. 4 is a circuit diagram showing a comparison unit associated with the detection unit in FIG. 3.

FIG. 4 is a circuit diagram showing a comparison unit 22 associated with the detection unit in FIG. 3. In FIG. 4, the comparison unit 22 is composed of (m+1) comparators. The inverting input terminal of each comparator receives a reference voltage Vb, the non-inverting input terminal receives a comparison voltage V0~Vm, and the output terminal outputs a control signal TS0~TSm. Since the comparison voltage V0~Vm decreases by degrees, there are (m+2) states for the control signals TS0~TSm. Each of the states is described as below:

State 0: All the control signals TS0~TSm are LOW. Meanwhile, V0 is smaller than Vb, thus $$R_s < \frac{R_b}{a \cdot n}.$$

State 1: The control signal TS0 is HIGH, while the other control signals TS1~TSm are LOW. Meanwhile, V0 is larger than Vb and V1 is smaller than Vb, thus $$\frac{R_b}{a \cdot n} \leq R_s < \frac{x+1}{x} \cdot \frac{R_b}{a \cdot n}.$$

State 2: The control signals TS0~TS1 are HIGH, while the other control signals TS2~TSm are LOW. Meanwhile, V1 is larger than Vb and V2 is smaller than Vb, thus $$\frac{x+1}{x} \cdot \frac{R_b}{a \cdot n} \leq R_s < \frac{x+2}{x} \cdot \frac{R_b}{a \cdot n}.$$

State m: The control signals TS0~TSm−1 are HIGH, while the control signal TSm is LOW. Meanwhile, Vm−1 is larger than Vb and Vm is smaller than Vb, thus $$\frac{x+m-1}{x} \cdot \frac{R_b}{a \cdot n} \leq R_s < \frac{x+m}{x} \cdot \frac{R_b}{a \cdot n}.$$

State m+1: All the control signals TS0~TSm are HIGH. Meanwhile, Vm is larger than Vb, thus $$\frac{x+m}{x} \cdot \frac{R_b}{a \times n} \leq R_s.$$

Accordingly, from the foregoing statements, it is obvious that State 0 as well as State m+1 represents the boundary of Rs and State 1 to State m represents an effective range of Rs. In other words, Rs ranges from $$\frac{R_b}{a \cdot n}$$

to $$\frac{x+m}{x} \cdot \frac{R_b}{a \cdot n}$$

with variation of $$\Delta R_{s,MAX} = \frac{m \cdot R_b}{a \cdot n \cdot x}.$$

Figure 5:
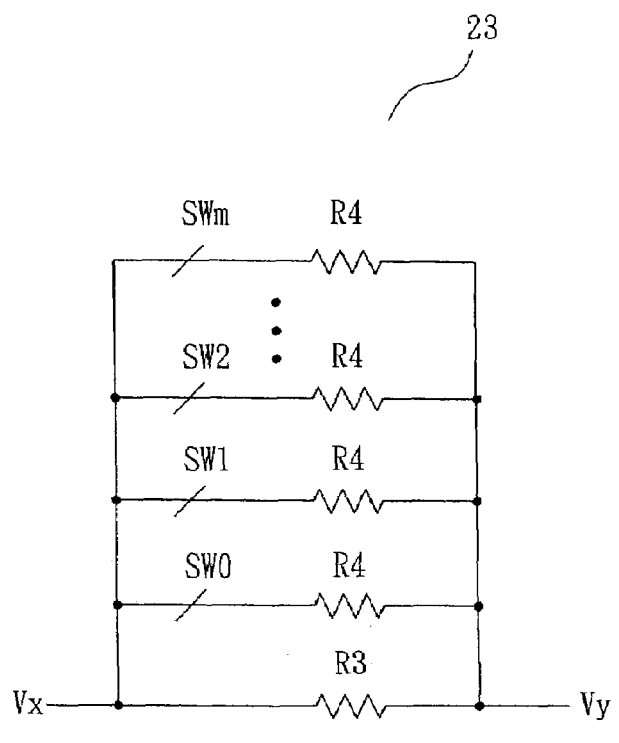
FIG. 5 is a circuit diagram showing a composite resistor unit associated with the detection unit in FIG. 3.

FIG. 5 is a circuit diagram showing a composite resistor unit 23 associated with the detection unit in FIG. 3. The composite resistor unit 23 is composed of a fundamental resistor R3 and (m+1) resistors R4 connected in parallel, wherein the fundamental resistor R3 is not provided with any switch, while each of the (m+1) resistors R4 is controlled by a switch SW0~SWm, respectively. If the resistance value of R3 is p·Rs, the resistance value of R4 is x·p·Rs. The switches SW0~SWm are controlled by the control signals TS0~TSm, respectively, from the comparison unit 22. Therefore, there are (m+2) states for the resistance value of the composite resistor unit 23. If TSx is HIGH, the switch SWx is turned on; otherwise, the switch is off, where $0 \leq x \leq m$. These states are described hereinafter.←

State 0: $RT = p \cdot R_s$, $RT < \frac{p}{a \cdot n} \cdot R_b$.

State 1: $RT = \frac{x}{x+1} \cdot p \cdot R_s$, $\frac{p}{a \cdot n} \cdot \frac{x}{x+1} \cdot R_b \leq RT < \frac{p}{a \cdot n} \cdot R_b$.

State 2: $RT = \frac{x}{x+2} \cdot p \cdot R_s$, $\frac{p}{a \cdot n} \cdot \frac{x+1}{x+2} \cdot R_b \leq RT < \frac{p}{a \cdot n} \cdot R_b$.

State m: $RT = \frac{x}{x+m} \cdot p \cdot R_s$, $\frac{p}{a \cdot n} \cdot \frac{x+m-1}{x+m} \cdot R_b \leq RT < \frac{p}{a \cdot n} \cdot R_b$.

State m+1: $RT = \frac{x}{x+m+1} \cdot p \cdot R_s$, $\frac{p}{a \cdot n} \cdot \frac{x+m}{x+m+1} \cdot R_b \leq RT$.

From the fore-mentioned discussion, only from State 1 to State m are valid, therefore, RT reaches its maximum error at State 1. $RT_{(ERR, MAX)}$ is expressed as:

$$RT_{(ERR,MAX)} = \frac{p}{a \cdot n} \cdot \left[ R_b - \frac{x}{x+1} \cdot R_b \right] = \frac{p}{a \cdot n} \cdot \frac{1}{x+1} \cdot R_b \quad (2)$$

Now, the parameters a, m, n, p, x are determined hereinafter. To begin with, the error range of the resistance value RT of the composite resistor unit 23, the maximum deviation range of Rs, and the reference resistor Rb have to be determined in advance. Below are some assumptions:

Assumption 1: The reference resistor Rb is 6.25 kΩ.

Assumption 2: If the maximum deviation range of Rs, DR, is 40%, the maximum error range of the composite resistor RT is less than 10%.

Assumption 3: If the sheet resistance value per unit area Rs is equal to 50 Ω and then V0 is equal to Vb, and meanwhile, the composite resistor RT is smaller than 50 Ω.

According to the foregoing assumptions, each parameter can be calculated by using the following 5 steps:

Step 1: By Eq. (2), $RT_{(ERR,MAX)} \leq 10\%$ $\Rightarrow x+1 \geq 10$ $\Rightarrow x \geq 9$ Therefore, we take x=10.

Step 2: From Assumption 3, $(a \cdot n \cdot 50)/R_b = 1$ $\Rightarrow a \cdot n = R_b/50 = 125$ Step 3:

$\Delta R_{s,MAX}/(R_b/(a \cdot n)) = m/x \geq 40\%$ $\Rightarrow m \geq 0.4 \cdot x = 4$ Therefore, we take m=4.

Step 4:

If we take a=2.5, $\Rightarrow n = 125/2.5 = 50$.

Step 5: From Assumption 3, the detection state is State 1. Hence, $(x/(x+1)) \cdot p \cdot R_s < 50$ $\Rightarrow p < (x+1)/x = 1.1$ Therefore, we take p=1.

From Step 1 to Step 5, we obtain a=2.5, n=50, p=1, m=4, and x=10. These values are then applied in Eq. (2) so that results can be obtained, as shown in Table 1. Note that the unit is in Ω.

TABLE I

| | | |
|---|---|---|
| State 0 | $R_s < 50$ | $RT < 50$ |
| State 1 | $50 \leq R_s < 55$ | $45.45 \leq RT < 50$ |
| State 2 | $55 \leq R_s < 60$ | $45.83 \leq RT < 50$ |
| State 3 | $60 \leq R_s < 65$ | $46.15 \leq RT < 50$ |
| State 4 | $65 \leq R_s < 70$ | $46.43 \leq RT < 50$ |
| State 5 | $70 \leq R_s$ | $46.67 \leq RT$ |
| | $\Delta R_{s,MAX} = 20$ | $RT_{ERR,MAX} = 4.55$ |
| | $\Delta R_{s,MAX}/50 = 40\%$ | $RT_{ERR,MAX}/50 = 9.1\%$ |

According to Table 1, even though the variation of Rs is as high as 40%, the variation of RT is only 9.1%.

Figure 6:
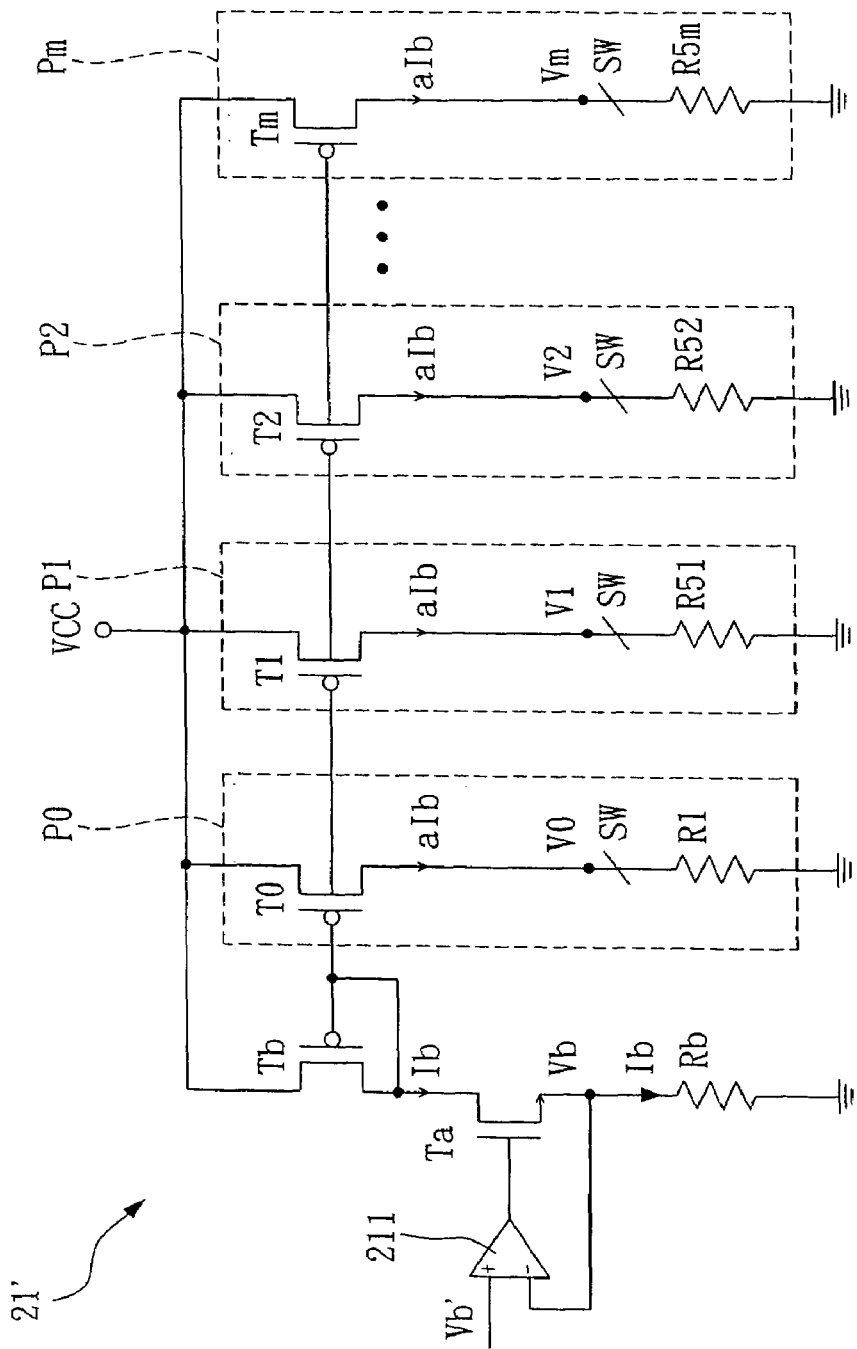
FIG. 6 is a circuit diagram showing a second embodiment of the detection unit in accordance with the present invention.

FIG. 6 is a circuit diagram showing a second embodiment of the detection unit 21' in accordance with the present invention. As shown in FIG. 6, the detection unit 21' is similar to the detection unit 21 in FIG. 3 that the former also comprises an operational amplifier 211, a reference current path Pb and (m+1) comparison current paths P0~Pm. The major difference of the detection unit 21' from detection unit 21 is that the resistance values in each of the comparison current paths in the second embodiment increase by degrees from P0 to Pm. That is, R1<R51<R52< . . . <R5m. In the present embodiment, if R1 is equal to n·R$_s$, the resistance value of R51, R52, . . . , R5m is designed to be (n+x)·R$_s$, (n+2x)·R$_s$, . . . , and (n+mx)·R$_s$, respectively. Thus, the comparison voltages V0~Vm across the comparison resistors increase by degrees. The voltages can be expressed as:

$$V_0 = aI_b \cdot nR_s = \frac{anR_s}{R_b} \cdot V_b$$

$$V_1 = aI_b \cdot (n+x) \cdot R_s = \frac{a \cdot (n+x) \cdot R_s}{R_b} \cdot V_b$$

$$V_2 = aI_b \cdot (n+2x) \cdot R_s = \frac{a \cdot (n+2x) \cdot R_s}{R_b} \cdot V_b$$

...

$$V_m = aI_b \cdot (n+mx) \cdot R_s = \frac{a \cdot (n+mk) \cdot R_s}{R_b} \cdot V_b$$

Moreover, in the comparison current paths P0~Pm, switches SW are employed to compensate the resistance values of the control switches of the composite resistors. Therefore, all the switches are on ON states.

FIG. 7 is a circuit diagram showing a comparison unit associated with the detection unit 21' in FIG. 6. In FIG. 6, the comparison unit 22' is composed of (m+1) comparators. The non-inverting input terminal of each comparator receives a reference voltage Vb, the inverting input terminal receives a comparison voltage V0~Vm, and the output terminal outputs a control signal TS0~TSm. Since the comparison voltage V0~Vm increases by degrees, there are (m+2) states for the control signals TS0~TSm. Each of the states is described as below:

State 0: All the control signals TS0~TSm are LOW. Meanwhile, V0 is larger than Vb, thus $$R_s > \frac{R_b}{a \cdot n}.$$

State 1: The control signal TS0 is HIGH, while the other control signals TS1~TSm are LOW. Meanwhile, V0 is smaller than Vb and V1 is larger than Vb, thus $$\frac{R_b}{a \cdot n} \geq R_s > \frac{R_b}{a \cdot (n+x)}.$$

State 2: The control signals TS0~TS1 are HIGH, while the other control signals TS2~TSm are LOW. Meanwhile, V1 is smaller than Vb and V2 is larger than Vb, thus $$\frac{R_b}{a \cdot (n+x)} \geq R_s > \frac{R_b}{a \cdot (n+2x)}.$$

State m: The control signals TS0~TSm−1 are HIGH, while the control signal TSm is LOW. Meanwhile, Vm−1 is smaller than Vb and Vm is larger than Vb, thus $$\frac{R_b}{a \cdot (n+mx-x)} \geq R_s > \frac{R_b}{a \cdot (n+mx)}.$$

State m+1: All the control signals TS0~TSm are HIGH. Meanwhile, Vm is larger than Vb, thus $$\frac{R_b}{a \cdot (n+mx)} \geq R_s.$$

Accordingly, from the foregoing statements, it is obvious that State 0 as well as State m+1 represents the boundary of Rs and State 1 to State m represents an effective range of Rs. In other words, Rs ranges from $$\frac{R_b}{a \cdot n}$$

to $$\frac{R_b}{a \cdot (n+mx)}$$

with variation of $$\Delta R_{s,MAX} = \frac{m \cdot x \cdot R_b}{a \cdot n \cdot (n+mx)}.$$

FIG. 8 is a circuit diagram showing a composite resistor unit 23' associated with the detection unit in FIG. 6. The composite resistor unit 23' is composed of a fundamental resistor R6 and m resistors R7 connected in series. If the resistance value of R6 is p·n·Rs, the resistance value of R4 is x·p·Rs. The switches SW0~SWm are controlled by the control signals TS0~TSm, respectively, from the comparison unit 22'. If the detection state is x, only SWx is turned on, where $0 \leq x \leq m$; if the detection state is (m+1), only SWm is turned on. Therefore, there are (m+2) states for the resistance value of the composite resistor unit 23'. These states are described hereinafter.

State 0: $RT = p \cdot n \cdot R_s, \frac{p}{a} \cdot R_b < RT.$

State 1: $RT = p \cdot (n+x) \cdot R_s, \frac{p}{a} \cdot R_b < RT \leq \frac{P \cdot (n+x)}{a \cdot n} \cdot R_b.$ State 2: $RT = p \cdot (n+2x) \cdot R_s, \frac{p}{a} \cdot R_b < RT \leq \frac{P \cdot (n+2x)}{a \cdot (n+x)} \cdot R_b.$ State m: $RT = p \cdot (n+mx) \cdot R_s, \frac{p}{a} \cdot R_b < RT \leq \frac{P \cdot (n+mx)}{a \cdot (n+mx-x)} \cdot R_b.$ State m+1: $RT \leq \frac{p}{a} \cdot R_b.$ From the fore-mentioned discussion, only from State 1 to State m are valid, therefore, RT reaches its maximum error at State 1. $RT_{(ERR, MAX)}$ is expressed as:

$$RT_{(ERR,MAX)} = \frac{p(n+x)}{a \cdot n} \cdot R_b - \frac{p}{a} \cdot R_b = \frac{p \cdot x}{a \cdot n} \cdot R_b \quad (3)$$

Now, the parameters a, m, n, p, x are determined hereinafter. To begin with, the error range of the resistance value RT of the composite resistor unit 23', the maximum deviation range of Rs, and the reference resistor. Rb have to be determined in advance. Below are some assumptions:

Assumption 1: The reference resistor Rb is 6.25 kΩ.

Assumption 2: If the maximum deviation range of Rs, DR, is 40%, the maximum error range of the composite resistor RT is less than 10%.

Assumption 3: If the sheet resistance value per unit area Rs is equal to 50 Ω and then V0 is equal to Vb, and meanehile the composite resistor RT is larger than 5 kΩ.

According to the foregoing assumptions, each parameter can be calculated by using the following 5 steps:

Step 1: By Eq. (3), $$RT_{(ERR,MAX)}/((p \cdot R_b)/a) = x/n \leq 10\%$$

Therefore, we take x/n=0.1.

Step 2: From Assumption 3, $$(a \cdot n \cdot 50)/R_b = 1$$

$$\Rightarrow a \cdot n = R_b/50 = 125.$$

Step 3:

$$\frac{\frac{\Delta R_s}{R_b}}{a \cdot n} = \frac{m \times x}{n + m \times x} \geq 40\% \Rightarrow m \geq 0.4 \cdot (10 + m) \Rightarrow m \geq 6.67$$

Therefore, we take m=7.
Step 4:
If we take a=2.5, $\Rightarrow$ n=125/2.5=50, and x=5.

Step 5: From Assumption 3, the detection state is State 1. Hence, $p \cdot (n+x)R_s > 5k$ $\Rightarrow$ p>1.8.

Therefore, we take p=2.

From Step 1 to Step 5, we obtain a=2.5, n=50, p=2, m=7, and x=5. These values are then applied in Eq. (3) so that results can be obtained, as shown in Table 2. Note that the unit is in Ω.

TABLE 2

| State 0 | 50 < $R_s$ | 5k < RT |
|---|---|---|
| State 1 | 45.45 < $R_s$ ≦ 50 | 5k < RT ≦ 5.5k |
| State 2 | 41.67 < $R_s$ ≦ 45.45 | 5k < RT ≦ 5.455k |
| State 3 | 38.46 < $R_s$ ≦ 41.67 | 5k < RT ≦ 5.417k |
| State 4 | 35.71 < $R_s$ ≦ 38.46 | 5k < RT ≦ 5.385k |
| State 5 | 33.33 < $R_s$ ≦ 35.71 | 5k < RT ≦ 5.357k |
| State 6 | 31.25 < $R_s$ ≦ 33.33 | 5k < RT ≦ 5.333k |
| State 7 | 29.41 < $R_s$ ≦ 31.25 | 5k < RT ≦ 5.313k |
| State 8 | $R_s$ ≦ 29.41 | RT ≦ 5k |
| | $\Delta R_{s,MAX}$ = 20.59 | $RT_{ERR,MAX}$ = 0.5k |
| | $\Delta R_{s,MAX}$/50 = 41% | $RT_{ERR,MAX}$/50 = 10% |

According to Table 2, even though the variation of Rs is as high as 41%, the variation of RT is only 10%.

Figure 9A:
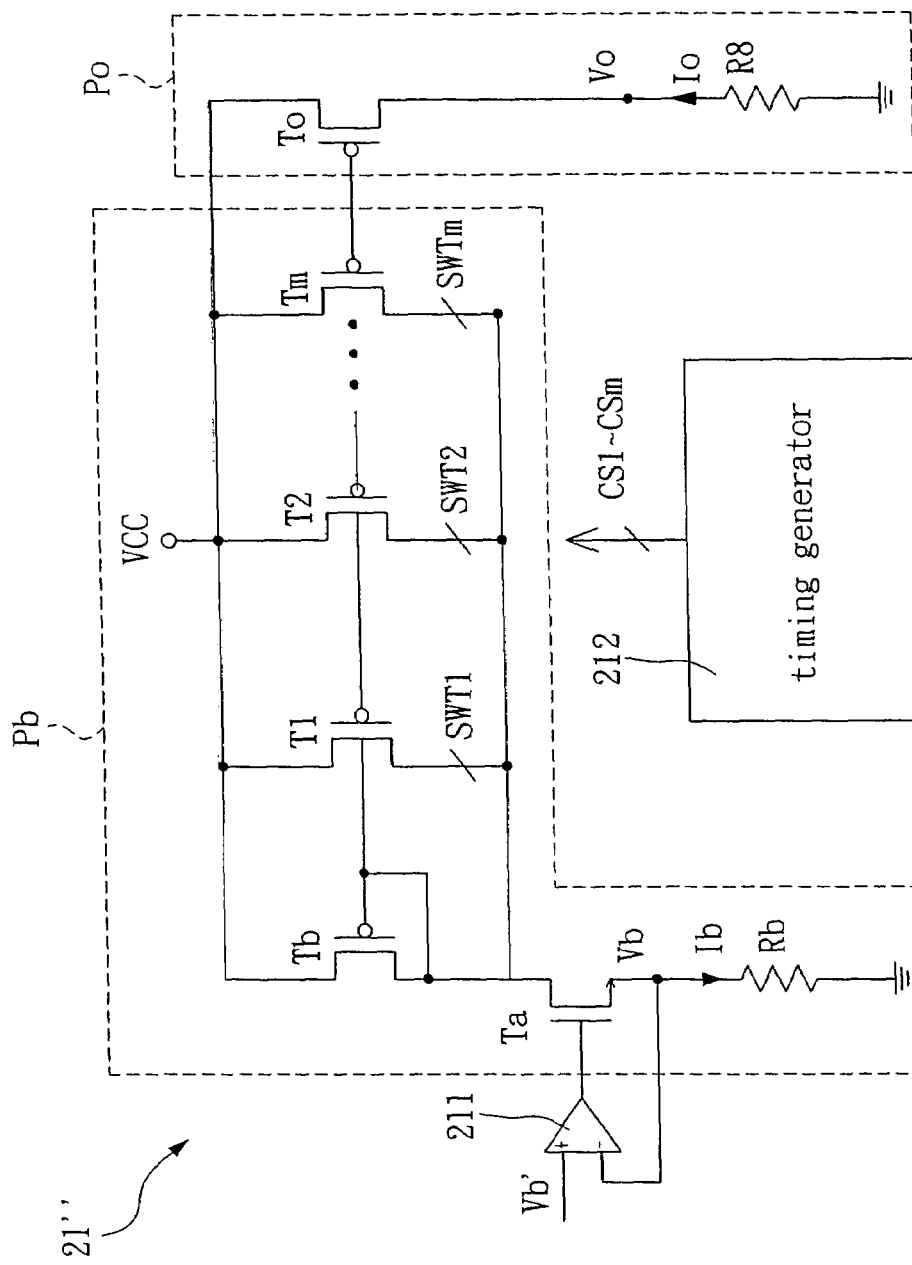
FIG. 9A is a circuit diagram showing a third embodiment of the detection unit in accordance with the present invention.
Figure 12:
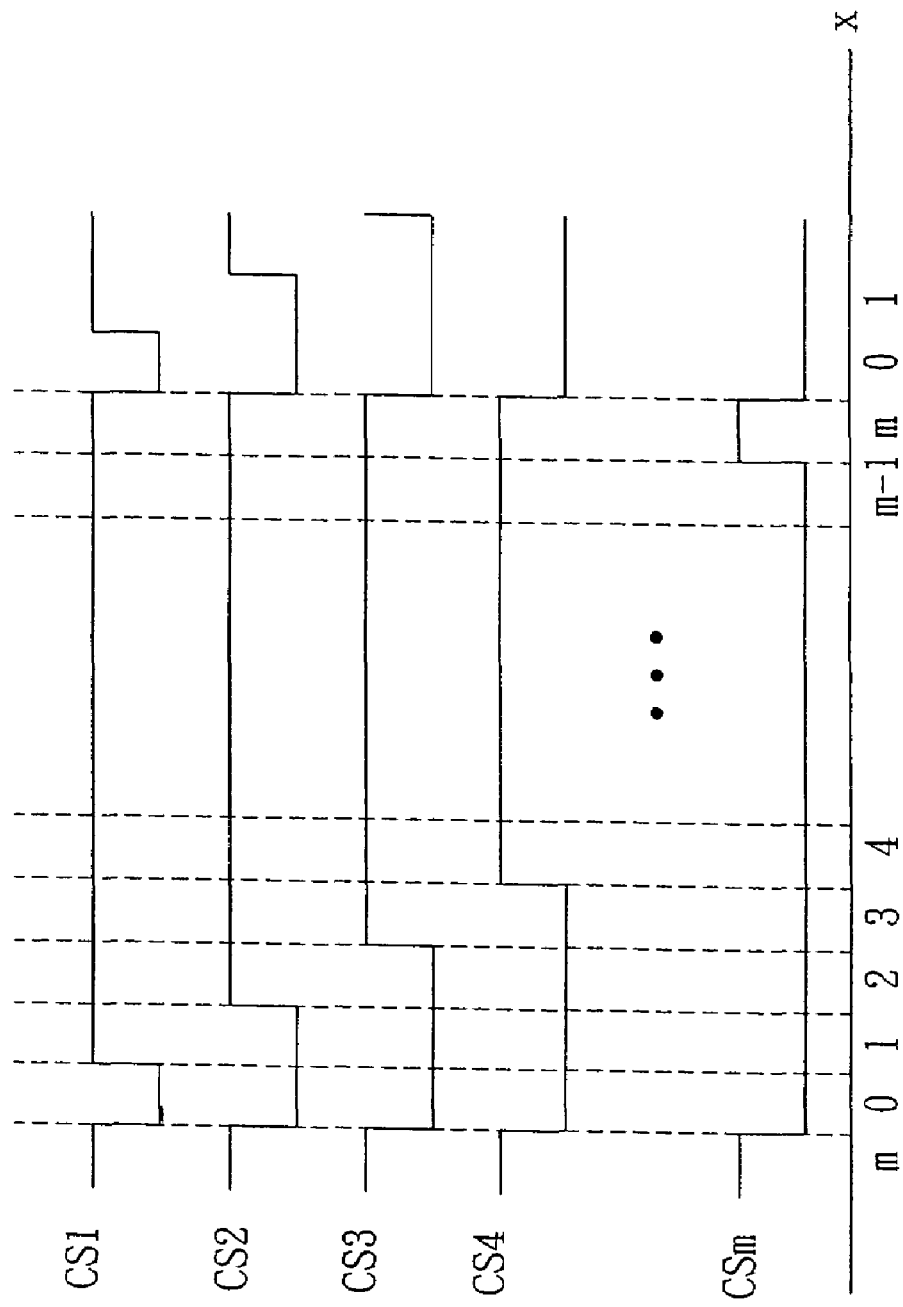
FIG. 12 is a timing diagram showing the signals controlling the switches of the detection unit in FIGS. 9A and 9B.

FIG. 9A is a circuit diagram showing a third embodiment of the detection unit 21" in accordance with the present invention. As shown in FIG. 9A, the detection unit 21" comprises an operational amplifier 211, a reference current path Pb and a comparison current path Po. The reference current path Pb of the detection unit 21" comprises a reference transistor unit composed of a primary reference transistor Tb and a plurality of secondary reference transistors T1~Tm connected in parallel. The reference current path Pb provides a reference current Ib through a transistor Ta into a resistor Rb. Each of the secondary reference transistors T1~Tm is controlled by a corresponding switch SWT1~SWTm, respectively. The corresponding switch SWT1~SWTm is controlled by using a periodic control signal CS1~CSm, respectively, generated by a timing generator 212. FIG. 12 is a timing diagram showing the signals controlling the switches of the detection unit in FIG. 9A. The comparison current path Po comprises an output transistor To and an output resistor R8, and the resistance value of R8 is nRs. If the aspect ratio of the primary reference transistor Tb, each of the secondary reference transistor T1~Tm, and the output transistor To is p:1:q and the control signal is High so that the switch SWTn is turned on, the output voltage can be expressed as:

$$V_{0,x} = I_{b,x} \cdot R_8 = \frac{q}{p+x} \frac{V_b}{R_b} \cdot n \cdot R_s, \quad \text{wherein } 0 \leq x \leq m$$

Figures 10, 11:
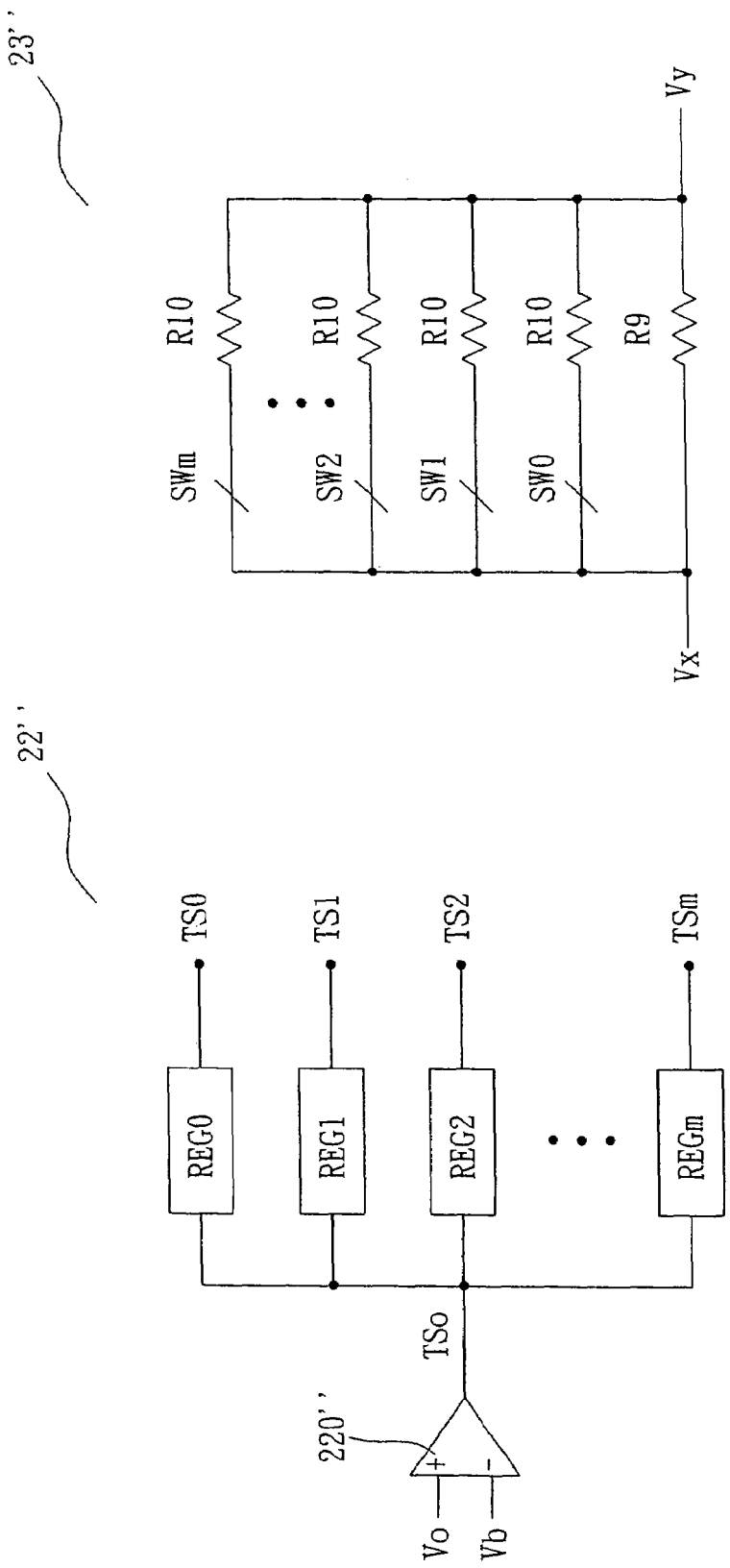
FIG. 10 is a circuit diagram showing a comparison unit associated with the detection unit in FIGS. 9A and 9B.
FIG. 11 is a circuit diagram showing a composite resistor unit associated with the detection unit in FIGS. 9A and 9B.

FIG. 10 is a circuit diagram showing a comparison unit associated with the detection unit 21" in FIG. 9A. In FIG. 10, the comparison unit is composed of a comparator 220". The non-inverting input terminal of the comparator receives an output voltage Vo, the inverting input terminal receives a reference voltage Vb, and the output terminal outputs an output signal TSo. The output signal TSo is stored in different registers REG0~REGm with time. That is, for each time interval x, the output signal Tso is start in REGx, respectively, wherein 0≦x≦m. The registers REG0~REGm output control signals TS0~TSm. Since the output voltage V0~Vm decreases by degrees with time, there are (m+2) states for the control signals TS0~TSm after a control period is completed. Each of the states is described as below:

State 0: All the control signals TS0~TSm are LOW. Meanwhile, $$R_s < \frac{p}{q \cdot n} \cdot R_b.$$

State 1: The control signal TS0 is HIGH, while the other control signals TS1~TSm are LOW. Meanwhile, $$\frac{p}{q \cdot n} \cdot R_b \leq R_s < \frac{p+1}{q \cdot n} \cdot R_b.$$

State 2: The control signals TS0~TS1 are HIGH, while the other control signals TS2~TSm are LOW. Meanwhile, V1 is smaller than Vb and V2 is larger than Vb, thus $$\frac{p+1}{q \cdot n} \cdot R_b \leq R_s < \frac{p+2}{q \cdot n} \cdot R_b.$$

State m: The control signals TS1~TSm−1 are HIGH, while the control signal TSm is LOW. Meanwhile, $$\frac{p+m-1}{q \cdot n} \cdot R_b \leq R_s < \frac{p+m}{q \cdot n} \cdot R_b.$$

State m+1: All the control signals TS1~TSm are HIGH. Meanwhile, $$\frac{p+m}{q \cdot n} \cdot R_b \leq R_S.$$

Accordingly, from the foregoing statements, it is obvious that State 0 as well as State m+1 represents the boundary of Rs and State 1 to State m represents an effective range of Rs. In other words, Rs ranges from $$\frac{p}{q \cdot n} \cdot R_b$$

to $$\frac{p+m}{q \cdot n} \cdot R_b$$

with variation of $$\Delta R_{s,\text{MAX}} = \frac{m}{q \cdot n} \cdot R_b.$$

FIG. 11 is a circuit diagram showing a composite resistor unit associated with the detection unit 21″ in FIG. 9A. The composite resistor unit is composed of a fundamental resistor R9 and (m+1) resistors R10 connected in parallel, wherein the fundamental resistor R9 is not provided with any switch, while each of the (m+1) resistors R10 is controlled by a switch SW0~SWm, respectively. If the resistance value of R9 is $$2a \cdot Rs \;//\; \frac{a}{p-1} \cdot R_s,$$

the resistance value of R10 is $a \cdot Rs$. The switches SW0~SWm are controlled by the control signals TS0~TSm, respectively, from the comparison unit 22″. If TSx is High, the switch SWx is turned on; otherwise, the switch is turned off, where $0 \leq x \leq m$. Therefore, there are (m+2) states for the resistance value of the composite resistor unit 23″. These states are described hereinafter.

State 0: $RT = \frac{2a \cdot R_s}{2p-1}$, $RT < \frac{p}{2p-1} \cdot \frac{2a}{n \cdot q} \cdot R_b$.

State 1: $RT = \frac{2a \cdot R_s}{2p+1}$, $\frac{p}{2p+1} \cdot \frac{2a}{n \cdot q} \cdot R_b \leq RT < \frac{p+1}{2p+1} \cdot \frac{2a}{n \cdot q} \cdot R_b$.

...

State m: $RT = \frac{2a \cdot R_s}{2p+2m-1}$, $$\frac{p+m-1}{2p+2m-1} \cdot \frac{2a}{n \cdot q} \cdot R_b \leq RT < \frac{p+m}{2p+2m-1} \cdot \frac{2a}{n \cdot q} \cdot R_b.$$

State m+1: $RT = \frac{2a \cdot R_s}{2p+2m+1}$, $\frac{p+m}{2p+2m+1} \cdot \frac{2a}{n \cdot q} \cdot R_b \leq RT$ From the fore-mentioned discussion, only from State 1 to State m are valid. It is evident that both the upper limit and the bottom limit of RT are either monotonously increasing or monotonously decreasing, and that the upper limit is always larger than the bottom limit. Therefore, RT is always within a certain range and reaches its maximum error at State 1. $RT_{(ERR, MAX)}$ is expressed as:

$$RT_{(ERR,\text{MAX})} = \frac{1}{2p+1} \cdot \frac{2a}{q \cdot n} \cdot R_b \quad (4)$$

Now, the parameters a, m, n, p, x are determined hereinafter. To begin with, the error range of the resistance value RT of the composite resistor unit 23″, the maximum deviation range of Rs, and the reference resistor Rb have to be determined in advance. Below are some assumptions:

Assumption 1: The reference resistor Rb is 5 kΩ.

Assumption 2: If the maximum deviation range of Rs, DR, is 40%, the maximum error range of the composite resistor RT is less than 10%.

Assumption 3: If the sheet resistance value per unit area Rs is equal to 50 Ω, q=2p, and SWT1~SWTm are open, and then Vo,0 is equal to Vb. Meanwhile the composite resistor RT is at least 200 Ω.

According to the foregoing assumptions, each parameter can be calculated by using the following 4 steps:

Step 1: From Assumption 3, $(q \cdot n \cdot R_s)/(p \cdot R_b) = 1$

⇒n=50.

Step 2:

$$\frac{RT_{(ERR,\text{MAX})}}{\frac{p}{2p+1} \cdot \frac{2a \cdot R_b}{q \cdot n}} = \frac{1}{p} \leq 0.1 \Rightarrow p \geq 10$$

Therefore, we take p=10 and thus q=20.

Step 3:

$$\frac{\Delta R_{s,\text{MAX}}}{\frac{p \cdot R_b}{q \cdot n}} = \frac{m}{p} \geq 40\% \Rightarrow m \geq 0.4 \cdot p = 4$$

Therefore, we take m=4.

Step 4: From Assumption 3, the detection state is State 1. Hence, $$\frac{2 \cdot a \cdot R_s}{2p+1} > 200 \Rightarrow a \geq 42.$$

Therefore, we take a=4.

From Step 1 to Step 4, we obtain a=42, n=50, p=10, m=4, and q=20. These values are then applied in Eq. (4) so that results can be obtained, as shown in Table 3. Note that the unit is in Ω.

TABLE 3

| State 0 | $R_s < 50$ | $RT < 221.05$ |
|---|---|---|
| State 1 | $50 \leq R_s < 55$ | $200 \leq RT < 220$ |
| State 2 | $55 \leq R_s < 60$ | $200.08 \leq RT < 219.13$ |
| State 3 | $60 \leq R_s < 65$ | $201.60 \leq RT < 218.40$ |
| State 4 | $65 \leq R_s < 70$ | $202.22 \leq RT < 217.78$ |
| State 5 | $70 \leq R_s$ | $202.76 \leq RT$ |
| | $\Delta R_{s,\text{MAX}} = 20$ | $RT_{\text{ERR,MAX}} = 20$ |
| | $\Delta R_{s,\text{MAX}}/50 = 40\%$ | $RT_{\text{ERR,MAX}}/200 = 10\%$ |

According to Table 3, even though the variation of Rs is as high as 40%, the variation of RT is only 10%.

Figure 9B:
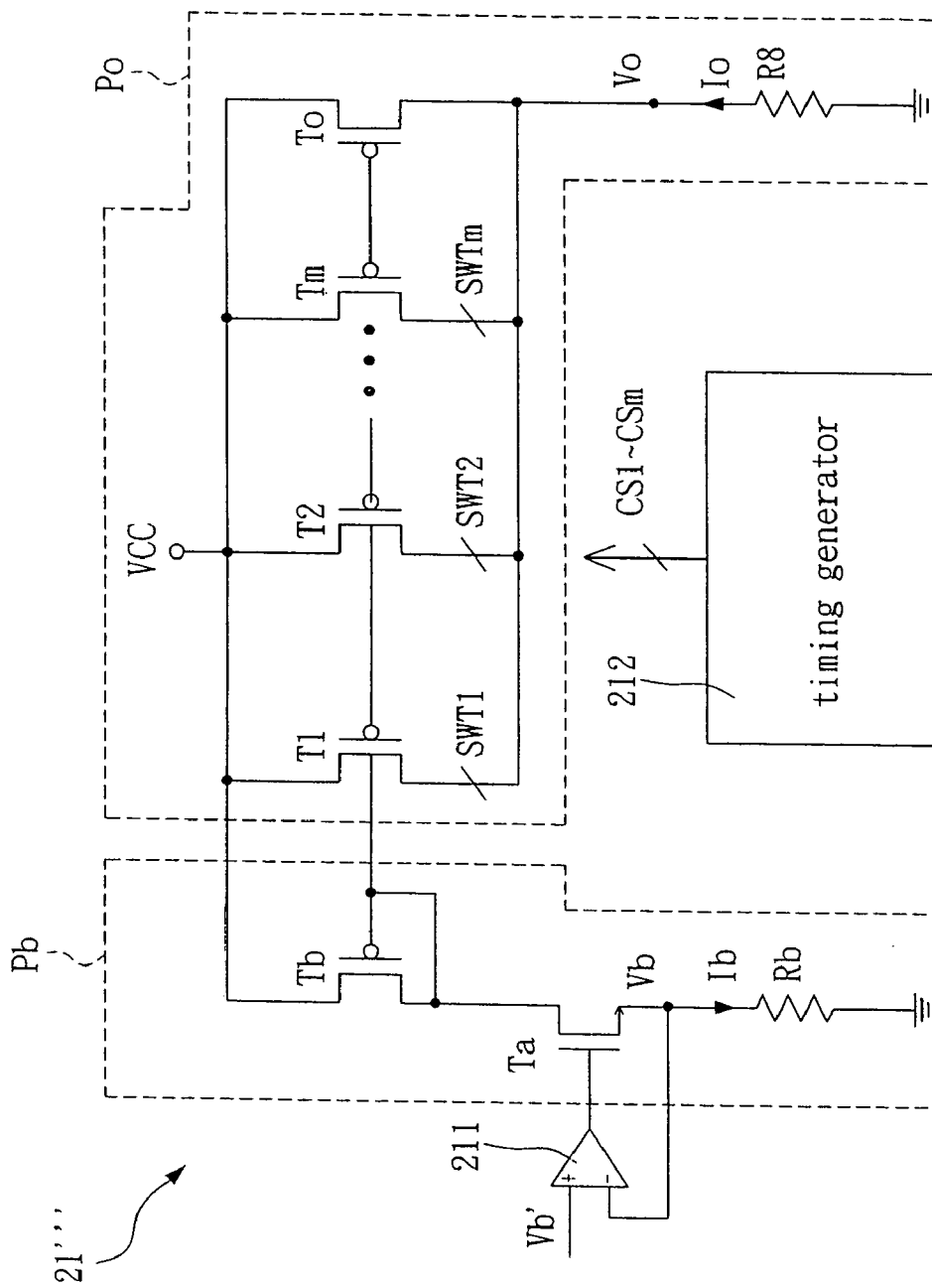
FIG. 9B is a circuit diagram showing a fourth embodiment of the detection unit in accordance with the present invention.

FIG. 9B is a circuit diagram showing a fourth embodiment of the detection unit 21'" in accordance with the present invention. As shown in FIG. 9B, the detection unit 21'" comprises an operational amplifier 211, a reference current path Pb and a comparison current path Po. The reference current path Pb provides a reference current Ib through a transistor Ta into a resistor Rb. The comparison current path Po comprises an output transistor unit composed of a primary output transistor To and a plurality of secondary output transistors T1~Tm connected in parallel. Each of the secondary output transistors T1~Tm is controlled by a corresponding switch SWT1~SWTm, respectively. The corresponding switch SWT1~SWTm is controlled by using a periodic control signal CS1~CSm, respectively, generated by a timing generator 212. FIG. 12 is a timing diagram showing the signals controlling the switches of the detection unit in FIG. 9B. FIG. 10 is a circuit diagram showing a comparison unit associated with the detection unit 21'" in FIG. 9B. FIG. 11 is a circuit diagram showing a composite resistor unit associated with the detection unit 21'" in FIG. 9B.

The parameters obtained in the foregoing embodiments should only be exemplary and explanatory but not be restrictive of the invention. Those who are skilled in this art can make modifications according to practical uses.

Furthermore, the present invention further discloses an impedance matching method, comprising steps of:

(a) a detection step, including: providing a reference voltage and a reference resistance, generating a reference current according to the reference resistance, and generating a plurality of comparison voltages corresponding to various resistance values according to the reference current;

(b) a comparison step, including: comparing the reference voltage and the plurality of comparison voltages, and generating a control signal; and (c) a composite resistor step, including: controlling a composite resistor unit having a plurality of switches by using the control signal so as to generate a matched impedance; wherein the control signal controls the operation of the switches.

In the detection step, a current mirror is employed to map the reference current onto a plurality of comparison current paths with various resistance values so as to generate the plurality of comparison voltages with various voltage values. The reference resistor can be implemented by using an external resistor so as to increase the accuracy of the output resistance. In the comparison step, a plurality of comparators are employed to compare the reference voltage and the comparison voltages so as to generate a plurality of control signals. The control signals further control the switches to obtain a required resistance value.

According to the above discussion, the present invention discloses an impedance matching circuit with automatic adjustment by using a composite resistor unit so as to generate a resistance value within a designed range and an impedance matching method. Therefore, the present invention has been examined to be progressive, advantageous and applicable to the industry.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An impedance adjusting circuit, comprising:
a reference current generating circuit for generating a reference current according to a reference voltage and a reference impedance;
a comparison voltage generating circuit for generating a plurality of comparison voltages according to the reference current;
a comparison circuit for comparing the reference voltage and each of the comparison voltages to generate a plurality of control signals; and
an impedance generating circuit for providing an output impedance according to the control signals, wherein the comparison circuit is coupled between the impedance generating circuit and the comparison voltage generating circuit, and the output impedance changes when the reference impedance changes.

2. The impedance adjusting circuit of claim 1, wherein the reference current generating circuit and the comparison voltage generating circuit form a current mirror structure.

3. The impedance adjusting circuit of claim 1, wherein the comparison voltage generating circuit comprises at least one comparison resistor and the comparison voltages are generated according to the reference current and the comparison resistor.

4. The impedance adjusting circuit of claim 1, wherein the impedance generating circuit comprises:
a plurality of resistors coupled together; and
a plurality of switches respectively coupled to the resistors;
wherein the on/off states of the switches are respectively determined by the control signals.

5. The impedance adjusting circuit of claim 1, wherein the impedance generating circuit comprises an adjustable resistor.

6. The impedance adjusting circuit of claim 1, wherein the number of the comparison voltages is predetermined.

7. The impedance adjusting circuit of claim 1, wherein the reference current generating circuit comprises:
a reference transistor coupled to the reference impedance, for receiving the reference voltage; and
a reference current source coupled to the reference impedance, for providing the reference current according to the reference voltage and the reference impedance.

8. The impedance adjusting circuit of claim 1, wherein the comparison voltages are generated increasingly or decreasingly.

9. The impedance adjusting circuit of claim 1, wherein the comparison voltages are generated sequentially.

10. The impedance adjusting circuit of claim 1, wherein the comparison circuit further comprises:
a plurality of registers for respectively storing the control signals.

11. The impedance adjusting circuit of claim 1, wherein time for generating the comparison voltages are substantially the same.

12. The impedance adjusting circuit of claim 1, wherein the comparison voltage generating circuit comprises at least one comparison current path.

13. The impedance adjusting circuit of claim 12, wherein the at least one comparison current path comprises:
one or more impedance circuits; and
at least one switch respectively coupled to at least one of the impedance circuits.

14. The impedance adjusting circuit of claim 13, further comprising:
a control unit for controlling the on/off state of the switch.

15. The impedance adjusting circuit of claim 12, wherein the comparison voltages are generated according to the effective impedance of the at least one comparison current path.

16. The impedance adjusting circuit of claim 15, wherein the comparison voltages are generated sequentially.

17. The impedance adjusting circuit of claim 1, wherein the reference current generating circuit comprises:
a plurality of scaled current paths coupled together;
wherein whether each of the scaled current paths conducts or not determines the comparison voltages.

18. The impedance adjusting circuit of claim 17, wherein two of the scaled current paths form a current mirror structure.

19. The impedance adjust circuit of claim 17, wherein the reference current generating circuit further comprises:
a control unit for determining whether each of the scaled current paths conducts or not.

20. The impedance adjusting circuit of claim 1, wherein the comparison voltage generating circuit comprises:
a plurality of scaled current paths coupled together;
wherein whether each of the scaled current paths conducts or not determines the comparison voltages.

21. The impedance adjusting circuit of claim 20, wherein two of the scaled current paths form a current mirror structure.

22. The impedance adjusting circuit of claim 20, wherein the comparison current path further comprises:
a control unit for determining whether each of the scaled current paths conducts or not.

23. A method for adjusting an impedance, comprising:
generating a reference current according to a reference voltage and a reference impedance;
generating a plurality of comparison voltages according to the reference current;
generating a plurality of control signals by comparing the reference voltage and each of the comparison voltages; and
providing an output impedance according to the control signals, wherein the output impedance changes when the reference impedance changes.

24. The method of claim 23, wherein the number of comparison voltages is predetermined.

25. The method of claim 23, wherein the comparison voltages are generated increasingly or decreasingly.

26. The method of claim 23, wherein the comparison voltages are generated sequentially.

27. The method of claim 23, wherein the comparison voltages are generated substantially at the same time.

28. The method of claim 23, further comprising:
storing the control signals.

* * * * *